United States Patent
Do

(10) Patent No.: US 9,847,297 B2
(45) Date of Patent: Dec. 19, 2017

(54) ELECTRONIC DEVICE AND METHOD FOR FABRICATING THE SAME

(71) Applicant: SK hynix Inc., Icheon-Si (KR)

(72) Inventor: Kwan-Woo Do, Icheon-si (KR)

(73) Assignee: SK hynix Inc., Icheon-Si (KR)

(*) Notice: Subject to any disclaimer, the term of this patent is extended or adjusted under 35 U.S.C. 154(b) by 88 days.

(21) Appl. No.: 14/846,808

(22) Filed: Sep. 6, 2015

(65) Prior Publication Data
US 2016/0181204 A1 Jun. 23, 2016

(30) Foreign Application Priority Data
Dec. 17, 2014 (KR) .................. 10-2014-0182537

(51) Int. Cl.
| H01L 23/532 | (2006.01) |
| H01L 45/00 | (2006.01) |
| H01L 43/02 | (2006.01) |
| H01L 43/08 | (2006.01) |
| H01L 23/528 | (2006.01) |
| G06F 12/0875 | (2016.01) |

(52) U.S. Cl.
CPC .... *H01L 23/53266* (2013.01); *G06F 12/0875* (2013.01); *H01L 23/528* (2013.01); *H01L 43/02* (2013.01); *H01L 43/08* (2013.01); *H01L 45/06* (2013.01); *H01L 45/08* (2013.01); *H01L 45/1233* (2013.01); *H01L 45/1253* (2013.01); *H01L 45/146* (2013.01); *H01L 45/147* (2013.01); *G06F 2212/452* (2013.01); *H01L 2924/0002* (2013.01)

(58) Field of Classification Search
CPC ............................ H01L 27/2426; H01L 45/08
USPC ............................................... 365/148; 257/4
See application file for complete search history.

(56) References Cited

U.S. PATENT DOCUMENTS

2013/0214237 A1* 8/2013 Tendulkar ............... H01L 45/08
257/4
2014/0254239 A1* 9/2014 Song .................. H01L 27/2436
365/148

FOREIGN PATENT DOCUMENTS

KR 10-2002-0043022 A 6/2002
KR 10-2004-0093553 A 11/2004

* cited by examiner

*Primary Examiner* — Jason Lappas
(74) *Attorney, Agent, or Firm* — Perkins Coie LLP

(57) ABSTRACT

This patent document provides an electronic device including a semiconductor memory that can simplify a fabrication process and improve characteristics of a variable resistance element, and a method for fabricating the same. In one aspect, an electronic device including a semiconductor memory is provided, wherein the semiconductor memory includes: a substrate; a variable resistance element formed over the substrate and exhibiting different resistance states to store data; an interlayer insulating layer formed over the substrate to surround at least a portion of the variable resistance element; an upper electrode contact formed over the variable resistance element to penetrate a portion of the interlayer insulating layer and be in contact with the variable resistance element; and a metal wiring formed over the interlayer insulating layer, and configured to include a stacked structure of a tungsten layer and a barrier layer, wherein the barrier layer is in contact with the upper electrode contact and includes tungsten, boron and iridium.

15 Claims, 11 Drawing Sheets

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0182537, entitled "ELECTRONIC DEVICE AND METHOD FOR FABRICATING THE SAME" and filed on Dec. 17, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an electronic device including a semiconductor memory which can be simply fabricated and can improve the characteristics of a variable resistance element, and a method for fabricating the same are provided.

In one aspect, an electronic device is provided to include a semiconductor memory that includes: a substrate; a variable resistance element formed over the substrate and exhibiting different resistance states to store data; an interlayer insulating layer formed over the substrate to surround at least a portion of the variable resistance element; an upper electrode contact formed over the variable resistance element to penetrate a portion of the interlayer insulating layer and be in contact with the variable resistance element; and a metal wiring formed over the interlayer insulating layer, and comprising a stacked structure of a tungsten layer and a barrier layer, wherein the barrier layer is in contact with the upper electrode contact and comprises tungsten, boron and iridium.

In some implementations, the electronic device may further comprising a lower electrode contact coupled to the substrate and the variable resistance element. In some implementations, the barrier layer has a content of the boron in a range of 1% to 10%. In some implementations, the barrier layer has a poly-crystallized hexagonal structure. In some implementations, the tungsten layer has a hexagonal structure.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, an electronic device may be provided to include a memory including unit cells that store data, each unit cell including: a substrate; a variable resistance element formed over the substrate and switched between different resistance states to store data depending on electrical charges applied to the variable resistance element; an electrode contact formed to provide the electrical charges to the variable resistance element; a metal wiring formed over the electrode contact and having a stacked structure including at least two layers, each layer having a hexagonal structure.

In some implementations, the stacked structure including a barrier layer and a tungsten layer, the barrier layer including tungsten, boron and iridium and a tungsten layer. In some implementations, the barrier layer has a content of the boron in a range of 1% to 10%. In some implementations, the barrier layer has a thickness in a range of 25 Å to 500 Å. In some implementations, the metal layer has grains with reduced size and reduced surface roughness as compared with a metal layer not including tungsten, boron and iridium.

In another apsect, an electronic device may be provided to include a semiconductor memory that includes: a substrate; a metal wiring formed over the substrate and having a stacked structure, the stacked structure comprising: a barrier layer capable of comprising tungsten, boron and iridium; and a tungsten layer.

In some implementations, the barrier layer has a content of the boron in a range of 1% to 10%. In some implementations, the barrier layer has a poly-crystallized hexagonal structure. In some implementations, the barrier layer has a thickness in a range of 25 Å to 500 Å. In some implementations, the metal layer has grains with reduced size and reduced surface roughness as compared with a metal layer not including tungsten, boron and iridium.

In another aspect, a method of manufacturing an electronic device comprising semiconductor memory may be provided. The method comprises: configuring a substrate; forming a barrier layer comprising tungsten, boron and iridium over a substrate; and forming a tungsten layer over the barrier layer. In another aspect, a method of fabricating an electronic device comprising a semiconductor memory is provided. The method comprises: configuring a substrate; forming a variable resistance element including two magnetic layers and a tunnel barrier layer interposed between the two magnetic layers; forming an electrode contact over the variable resistance element to provide an electrical connection to the variable resistance element; forming a barrier layer over the electrode contact to include tungsten, boron and iridium; and forming a tungsten layer over the barrier layer.

In some implementations, the forming of the barrier layer includes performing a chemical vapor deposition process or an atomic layer deposition process. In some implementations, the performing of the chemical vapor deposition process includes repeating processes including injecting a tungsten source gas, injecting a purge gas, injecting a boron source gas, injecting a purge gas, injecting an iridium source gas, and injecting a purge gas. In some implementations, the tungsten source gas comprises $WF_6$. In some implementations, the iridium source gas comprises $IrF_6$, $IrCl_3$, $Ir(acac)_3$, $Ir(allyl)_3$ or $CpIr(C_2H_4)_2$. In some implementations, the boron source gas comprises $B_2H_6$. In some implementations, the performing of the chemical vapor deposition process comprises utilizing $H_2$ as a reaction gas. In some implementations, the forming of the barrier layer is performed such that the barrier layer has a content of the boron in a range of 1% to 10% in the barrier layer. In some implementations, the forming of the barrier layer and the forming of the tungsten layer are performed in the same chamber.

DETAILED DESCRIPTION

Figure 1:
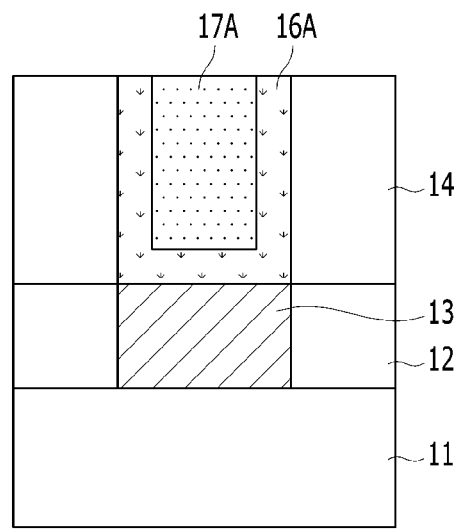
FIG. 1 is a cross-sectional view explaining an exemplary semiconductor device according to an implementation of the disclosed technology in the patent document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view explaining an exemplary semiconductor device according to an implementation of the disclosed technology in the patent document.

As shown in FIG. 1, a semiconductor device according to an implementation of the disclosed technology in the patent document may include a first interlayer insulating layer 12 formed over a substrate 11, a contact plug 13 formed to penetrate the first interlayer insulating layer 12 to be in contact with the substrate 11, a second interlayer insulating layer 14 formed over the first interlayer insulating layer 12, a barrier layer 16A formed to penetrate the second interlayer insulating layer 14 to be in contact with the contact plug 13, and a metal wiring having a stacked structure of a metal layer 17A.

In some implementations, the barrier layer 16A may include tungsten, boron and iridium. The barrier layer 16A may include a structure in which a tungsten-iridium alloy is doped with boron. The tungsten-iridium alloy has a stable hexagonal structure at a specific temperature (e.g. at 600° C. or less). When the tungsten-iridium alloy is doped with boron, the boron is placed between crystal lattices of the tungsten-iridium alloy to poly-crystallize the hexagonal structure. Thus, the crystals of the metal layer 17A deposited over the barrier layer 16A are reduced and the metal layer 17A can have a hexagonal structure. In addition, since boron assists or facilitates changes in the crystal structures of tungsten and iridium, adhesion between the barrier layer 16A and a lower layer can be improved.

In some implementations, the content of boron in the barrier layer 16A may be adjusted not to exceed at an upper limit, e.g., 10%. For example, the content of boron in the barrier layer 16A may be adjusted to be in a range of 1% to 10%. When the content of boron exceeds 10%, the resistance of the barrier layer 16A may increase to a sufficient level to deteriorate the property of the metal wiring. Therefore, the content of boron corresponding to a metalloid may be adjusted not to exceed at such an upper limit (e.g., 10%). In some implementations, the composition ratio of tungsten, boron and iridium in the barrier layer 16A may be adjusted to 4:1:5. Such composition ratio of materials in the barrier layer 16A is provided as an example, and other implementations are also possible. For example, the composition ratio of materials can be adjusted in various manners if the barrier layer 16A forms a stable hexagonal structure and the content of boron does not exceed 10%.

The barrier layer 16A may be formed to have a thickness, for example, in a range of 25 Å to 500 Å so as to adjust the size of the grains of the metal layer 17A. When the thickness of the barrier layer 16A is less than 25 Å, it is difficult to obtain a continuous thin film, and when the thickness of the barrier layer 16A exceeds 500 Å, the crystallinity of the barrier layer 16A increases to deteriorate the crystallinity of the metal layer 17A.

For example, the metal layer 17A may include a tungsten layer. The metal layer 17A may be formed to have a stable hexagonal structure by the barrier layer 16A having the poly-crystallized hexagonal structure. The crystallinity of the barrier layer 16A causes the metal layer 17A deposited over the barrier layer 16A to have a hexagonal structure as well. Thus, the size of the grains of the metal layer 17A can be reduced and the surface roughness of the metal layer 17A can be reduced.

FIGS. 2a to 2d are cross-sectional views explaining an example of a method for fabricating the semiconductor device according to one implementation of the disclosed technology in the patent document. In the below, FIGS. 2a to 2d will be explained together with FIG. 3 which is a timing diagram explaining an example of a method for forming a barrier layer according to the disclosed technology in the patent document. While FIGS. 2a to 2d are shown to explain a method for fabricating the semiconductor device shown in FIG. 1, the same reference numerals are used for the same parts for facilitating the understanding of FIGS. 2a to 2d.

Figure 2A:
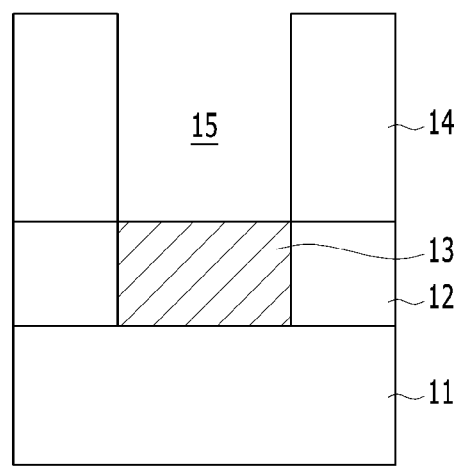
FIGS. 2A through 2D are cross-sectional views explaining an example of a method for fabricating the semiconductor device according to the implementation of the disclosed technology in the patent document.

As shown in FIG. 2a, the first interlayer insulating layer 12 may be formed over the substrate 11. The first interlayer insulating layer 12 may include an insulating material. The first interlayer insulating layer 12 may include any single layer including an oxide layer, a nitride layer, or an oxynitride layer, or a stacked structure thereof.

Subsequently, the contact plug 13 may be formed to penetrate the first interlayer insulating layer 12 and to be in contact with the substrate 11. The contact plug 13 may be formed by a series of processes including forming a contact hole to penetrate the first interlayer insulating layer 12 and to expose the substrate 11, forming a conductive material on the surface (e.g., the entire surface) of the resultant structure to gap-fill the contact hole, and performing an isolation process for electrically isolating adjacent contact plugs 13 from one another. The isolation process may be performed by etching or polishing the conductive material formed over the surface (e.g., the entire surface) through a blanket etching process (for example, etch back process) or a chemical mechanical polishing process until the first interlayer insulating layer 12 is exposed.

Then, the second interlayer insulating layer 14 may be formed over the first interlayer insulating layer 12 including the contact plug 13. The second interlayer insulating layer 14 may include the same material as the first interlayer insulating layer 12.

Subsequently, a contact hole 15 may be formed to penetrate the second interlayer insulating layer 14 and to expose the contact plug 13.

Figure 2B:
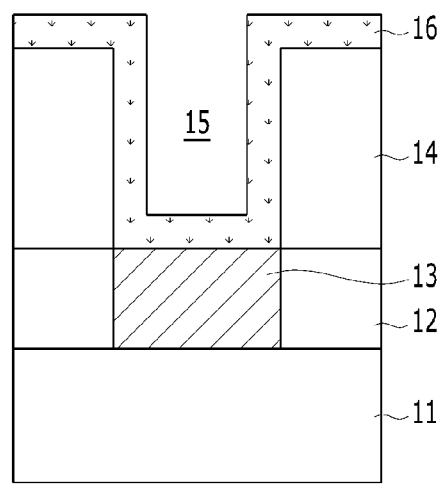

As shown in FIG. 2b, a barrier layer 16 including tungsten, boron and iridium may be formed along the structure (e.g., the entire structure) including the contact hole 15. The barrier layer 16 including the tungsten, boron and iridium may include a structure in which a tungsten-iridium alloy is doped with boron.

Figure 3:
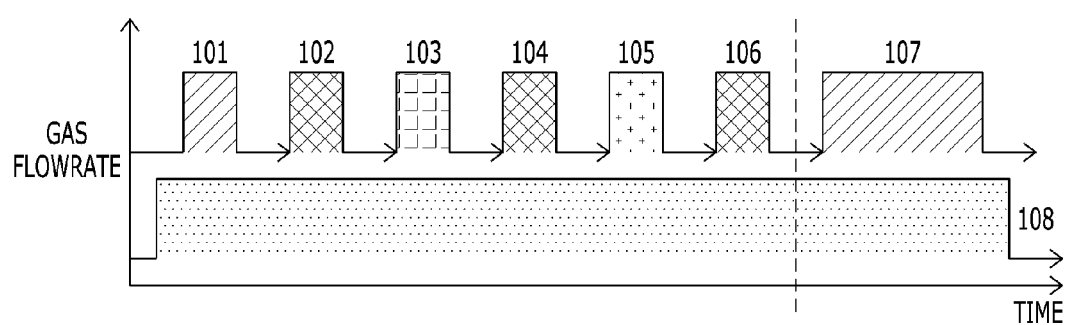
FIG. 3 is a timing diagram explaining an example of a method for forming a barrier layer according to an implementation of the disclosed technology in the patent document.

The barrier layer 16 may be formed through a chemical vapor deposition (CVD) process or an atomic layer deposition (ALD) process. FIG. 3 is a timing diagram explaining an example of a method for forming a barrier layer. When the barrier layer 16 is formed through the chemical vapor deposition (CVD) process, one cycle including the steps of injecting a tungsten source gas (step 101 in FIG. 3), injecting a purge gas (step 102 in FIG. 3), injecting a boron source gas (step 103 in FIG. 3), injecting a purge gas (step 104 in FIG. 3), injecting an iridium source gas (step 105 in FIG. 3), and injecting a purge gas (step 106 in FIG. 3) may be repeatedly performed. In addition, when the chemical vapor deposition (CVD) process is performed, $H_2$ gas may be used as a reaction gas which is indicated by reference numeral 108.

In step 101, a tungsten source gas is injected. In some implementations, the tungsten source gas may include, for example, $WF_6$. In this case, the tungsten source gas may be supplied, for example, at a flow rate in a rage of 300 sccm to 3000 sccm. In step 103, a boron source gas is injected. In some implemenatations, the boron source gas may include, for example B$_2$H$_6$. In step 105, an iridium source gas is injected. In some implementations, the iridium source gas may include, for example, any source gas including IrF$_6$, IrCl$_3$, Ir(acac)$_3$, Ir(allyl)$_3$ or CpIr(C$_2$H$_4$)$_2$. In some implementations, various applicable source gases can be used in each step. Steps 102, 104 and 106 of injecting the purge gas is performed to remove gas unreacted and remained at each step, and may be performed using an H$_2$ gas. In this case, at least one of the reaction gase and purge gase may be supplied, for example, at a flow rate in a rage of 300 sccm to 5000 sccm.

The step of forming the barrier layer 16 may be performed at a temperature of 600° C. or less. Thus, tungsten and iridium can have a stable lattice structure. For example, the step of forming the barrier layer 16 may be performed at a temperature in a range of 250° C. to 500° C.

Meanwhile, the content of boron in the barrier layer 16 may be adjusted not to exceed at most 10%, e.g. may be adjusted to be in a range of 1% to 10%. When the content of boron exceeds 10%, the resistance of the barrier layer 16 may increase to deteriorate the property of the metal wiring. Therefore, the content of boron corresponding to a metalloid may be adjusted not to exceed at most 10%. In some implementations, the composition ratio of tungsten, boron and iridium in the barrier layer 16 may be adjusted to 4:1:5. Such composition ratio of materials in the barrier layer 16 is provided as an example and other implementations are also possible. For example, the composition ratio of materials may be adjusted to any suitable values if the barrier layer form a stable hexagonal structure and the content of boron in the barrier layer does not exceed 10%.

The barrier layer 16 may be formed to have a thickness, for example, in a range of 25 Å to 500 Å so as to adjust the size of the grains of a metal layer to be formed by a following process.

Figure 2C:
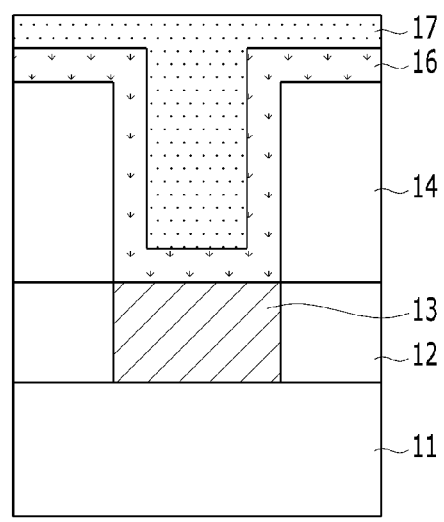

As shown in FIG. 2c, a metal layer 17 to fill the remaining portion of the contact hole 15 may be formed over the barrier layer 16. The metal layer 17 may include, for example, a tungsten layer. The tungsten layer may be formed in situ in the same chamber in which the barrier layer 16 is formed.

The step of forming the metal layer 17 (step 107 of FIG. 3) may be performed using the same source gas as that used for forming the tungsten layer in the barrier layer 16. When the metal layer 17 is configured with or includes a tungsten layer, the tungsten layer may include WF$_6$ and H$_2$ as a tungsten source gas and a reaction gas, respectively.

In some implementations, since the barrier layer 16 is formed to include tungsten, boron and iridium and have a poly-crystallized hexagonal structure, it is possible to reduce the crystals of the metal layer 17 and cause the metal layer 17A to have a hexagonal structure. Thus, the size of the grains of the metal layer 17 can be reduced, and the surface roughness of the metal layer 17 can be improved. In addition, as the surface roughness of the metal layer 17 is improved, a planarizing process after the formation of the metal layer can be omitted. Thus, the process margin can be secured.

Figure 2D:
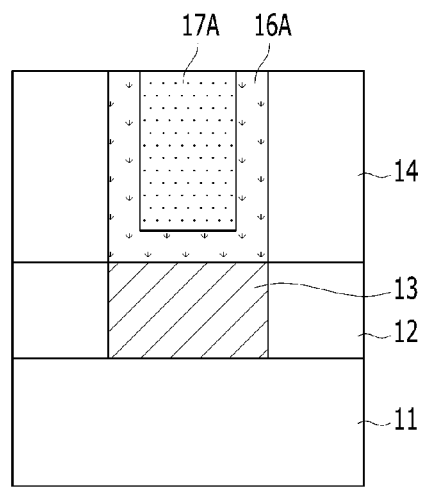

As shown in FIG. 2d, a separating process may be performed on the metal layer 17 (see FIG. 2c) and the barrier layer 16 (see FIG. 2c). A barrier layer 16A and a metal layer 17A, which have been subjected to the separating process, can remain to fill the inside of the contact hole 15.

Although the metal wiring of the present implementation has been described to have a damascene structure, other implementations are also possible. The metal wiring can be formed to include various wirings and/or electrode structures to which a tungsten layer is applied.

Figure 4:
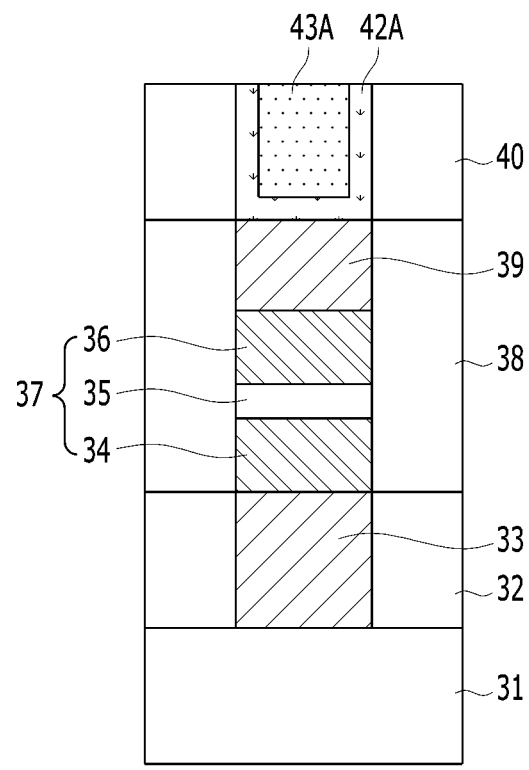
FIG. 4 is a cross-sectional view explaining an exemplary semiconductor device according to an implementation of the disclosed technology in the patent document.

FIG. 4 is a cross-sectional view explaining an exemplary semiconductor device according to one implementation of the disclosed technology in the patent document.

As shown in FIG. 4, a semiconductor device according to this implementation of the disclosed technology in the patent document may include a substrate 31 including a predetermined structure (not shown), a first interlayer insulating layer 32 formed over the substrate 31, a lower electrode contact 33 configured to penetrate the first interlayer insulating layer 32 and be coupled to the substrate 31, a variable resistance element 37 formed over the lower electrode contact 33, a second interlayer insulating layer 38 filled in or cover the space between the variable resistance elements 37, an upper electrode contact 39 formed over the variable resistance element 37 to be contacted with the top of the variable resistance element 37, a third interlayer insulating layer 40 formed over the second interlayer insulating layer 38, a barrier layer 42A formed along a contact hole penetrating the third interlayer insulating layer 40 and configured to include tungsten, boron and iridium, and a metal layer 43A formed over the barrier layer 42A. The barrier layer 42A and the metal layer 43A may function as metal wirings of the semiconductor device.

The substrate 31 include the predetermined structure i including a switching element for selecting a specific unit cell from a plurality of unit cells included in the semiconductor device, or the like. The switching element may include a transistor, or a diode, or the like. One terminal of the switching element may be electrically coupled to the lower electrode contact 33, and another terminal of the switching element may be electrically coupled to a source line (not shown) through a source line contact (not shown).

The first to third interlayer insulating layers 32, 38 and 40 may include an insulating material. The first to third interlayer insulating layers 32, 38 and 40 may include any single layer including an oxide layer, a nitride layer, or an oxynitride layer, or a stacked structure thereof.

The lower electrode contact 33 functions to provide a passage for supplying a voltage or current to the variable resistance element 37 from the underside of the variable resistance element 37, and may include various conductive materials, for example, metal or metal nitride, and the like.

The variable resistance element 37 may include a material which has a characteristic that is switched between mutually different resistance states depending on voltages and current supplied to the variable resistance element 37. For example, the variable resistance element 37 may include various materials, used in an RRAM, a PRAM, an FRAM, or an MRAM, or the like. In some implementations, the variable resistance element 37 may include, e.g. a transition metal oxide, a metal oxide such as a perovskite-based material, a phase change material such as a chalcogenide-based material, a ferroelectric material, or a ferromagnetic material, and the like. The variable resistance element 37 may have a single layer structure or a multi-layer structure in which two or more layers are combined to have a variable resistance characteristic.

For example, the variable resistance element 37 may include a magnetic tunnel junction (MTJ) structure which includes a first magnetic layer 34, a second magnetic layer 36, and a tunnel barrier layer 35 interposed between the first magnetic layer 34 and the second magnetic layer 36.

Each of the first magnetic layer 34 and the second magnetic layer 36 may be configured with a single layer or a multiple layer, which includes ferromagnetic materials, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, or a Co—Ni—Pt alloy, or the like. One of the first and second magnetic layers 34 and 36 may have a variable magnetization direction to function as a free layer or a storage layer, and the other may have a fixed magnetization direction to function as a pinned layer or a reference layer. The tunnel barrier layer 35 may change the magnetization direction of the free layer by tunneling electrons. The tunnel barrier layer 35 may be configured with a single layer or a multiple layer which includes an oxide, for example, $Al_2O_3$, MgO, CaO, SrO, TiO, VO, or NbO, or the like.

When the magnetization directions of the first and second magnetic layers 34 and 36 are parallel to each other, the variable resistance element 37 may have a low-resistance state and store, for example, data "0". When the magnetization directions of the first and second magnetic layers 34 and 36 are anti-parallel to each other, the variable resistance element 37 may have a high-resistance state and store, for example, data "1". In addition to such an MTJ structure, the variable resistance element 37 may additionally include various layers for securing the characteristics of the MTJ structure.

Also, as another example, the variable resistance element 37 may include a metal oxide which includes oxygen vacancies of which the electric resistance is changed by migration of the oxygen vacancies.

The upper electrode contact 39 may function to electrically couple the variable resistance element 37 and metal wirings 42A and 43A to each other. Further, the upper electrode contact 39 may function as an electrode for the variable resistance element 37. In some implementations, the upper electrode contact 39 may be formed with the same material as the lower electrode contact 33.

The metal wirings 42A and 43A may include a metal layer. The metal wirings 42A and 43A may include a stacked structure in which a barrier layer 42A including tungsten, boron and iridium and a tungsten layer 43A are stacked.

The barrier layer 42A may have a poly-crystallized hexagonal structure. The barrier layer 42A may include a structure in which a tungsten-iridium alloy is doped with boron. The content of boron in the barrier layer 42A may be adjusted not to exceed at most 10%. In some implementations, the content of boron in the barrier layer 42A may be adjusted to be in a range of 1% to 10%. In some implementations, the composition ratio of tungsten, boron and iridium in the barrier layer 42A may be adjusted to 4:1:5. The composition ratio of materials in the barrier layer 42A is provided as an example and other implementations are not possible. For example, the composition ratio of materials may be adjusted in various manners if the barrier layer 42A forms a stable hexagonal structure within the limit that the content of boron does not exceed 10%.

The barrier layer 42A may be formed to have a thickness, for example, in a range of 25 Å to 500 Å so as to adjust the size of the grains of the metal layer 43A. When the thickness of the barrier layer 42A is less than 25 Å, it is difficult to obtain a continuous thin film, and when the thickness of the barrier layer 42A exceeds 500 Å, the crystallinity of the barrier layer 42A increases to deteriorate the crystallinity of the metal layer 43A. However, other implementations are also possible regarding the thickness of the barrier layer 42A. For example, the thickness of the barrier layer 42A may be changed depending on the size of the element, the thickness of the metal layer 43A, or the like.

For example, the metal layer 43A may be formed to have a hexagonal structure by the barrier layer 42A which includes tungsten, boron and iridium. As compared with a tungsten layer to which the barrier layer 42A including tungsten, boron and iridium is not applied, the metal layer 43A of the present implementation may have the reduced size of the grains and the reduced surface roughness.

FIGS. 5a to 5f are cross-sectional views explaining an example of a method for fabricating the semiconductor device according to one implementation of the disclosed technology in the patent document. FIGS. 5a to 5f are shown to explain a method for fabricating the semiconductor device shown in FIG. 4, wherein the same reference sign is used for the same parts for the purpose of facilitating the understanding of FIGS. 5a to 5f.

Figure 5A:
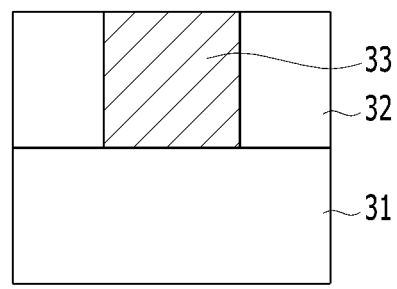
FIGS. 5A through 5F are cross-sectional views explaining an example of a method for fabricating the semiconductor device according to an implementation of the patent document.

As shown in FIG. 5a, the first interlayer insulating layer 32 may be formed over the substrate 31 including a predetermined structure. The predetermined structure may include a switching element or the like. The substrate 31 may include a semiconductor substrate, or a silicon substrate, or the like. The first interlayer insulating layer 32 may include any single layer including an oxide layer, a nitride layer, or an oxynitride layer, or a stacked structure thereof.

Subsequently, the lower electrode contact 33 may be formed to penetrate the first interlayer insulating layer 32 and to be in contact with the substrate 31. The lower electrode contact 33 may be formed by a series of processes including forming a contact hole to penetrate the first interlayer insulating layer 32 and to expose the substrate 31, forming a conductive material on the surface (e.g., the entire surface) of the resultant structure to gap-fill the contact hole, and performing an isolation process for electrically isolating adjacent lower electrode contact 33 from one another. The isolation process may be performed by etching (or polishing) the conductive material formed over the surface (e.g., the entire surface) through a blanket etching process (for example, etch back process) or a chemical mechanical polishing process until the first interlayer insulating layer 32 is exposed.

Figure 5B:
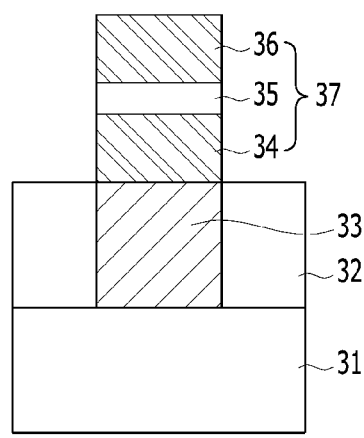

As shown in FIG. 5b, the variable resistance element 37 may be formed over the lower electrode contact 33. Although the variable resistance element 37 is illustrated to have the same line width as the lower electrode contact 33, the variable resistance element 37 may be adjusted to have a line width greater or less than that of the lower electrode contact 33 according to necessity. An electrode layer (not shown) may be additionally included over or under the variable resistance element 37.

The variable resistance element 37 may have a characteristic that is switched between mutually different resistance states or between mutually different resistance values depending on a bias (e.g. a voltage or current) applied through an upper electrode and/or a lower electrode. Such a characteristic may be utilized in various fields. For example, the variable resistance element 37 may be used as a data storage for storing data.

The variable resistance element 37 may show a variable resistance characteristic by using a bias applied through an upper electrode and/or a lower electrode. For example, the variable resistance element 37 may include a phase change material. The phase change material may include a chalcogenide compound. The phase change material has a crystal state which is changed to an amorphous state or a crystalline state in response to an external stimulus (e.g. a voltage or electric current) and can have a characteristic switched between different resistance states. In addition, the variable resistance element 37 may include a metal oxide. The metal oxide may include a transition metal oxide (TMO) or a Perovskite-based oxide or the like. The metal oxide may include intralayer vacancies and have a characteristic switched between mutually different resistance states by the production and extinction of conductive paths, which result from the migration of the vacancies due to an external stimulus. In some implementations, the variable resistance element 37 may include a stacked layer having the tunnel barrier layer 35 interposed between two magnetic layers 34 and 36. The stacked structure having the tunnel barrier layer interposed between the two magnetic layers is also referred to as "magnetic tunnel junction" (MTJ). When the magnetization directions of the two magnetic layers 34 and 36 are the same (or parallel to each other), the stacked layer may have a low-resistance state, and when the magnetization directions of the two magnetic layers 34 and 36 are mutually different (or anti-parallel to each other), the stacked layer can have a high-resistance state. However, the present implementation is not limited thereto, and the variable resistance element 37 may be made of or include any material satisfying the variable resistance characteristic switched between mutually different resistance states in response to a bias applied to the variable resistance element 37 through an upper electrode and/or a lower electrode.

Then, in some implementations, a spacer (not shown) may be formed on the side wall of the variable resistance element 37.

Figure 5C:
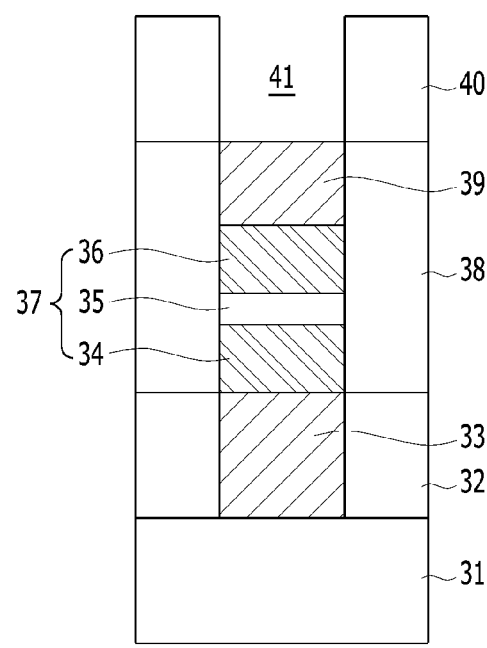

As shown in FIG. 5c, the second interlayer insulating layer 38 may be formed over the first interlayer insulating layer 32. The second interlayer insulating layer 38 may be formed to have a thickness enough to fill the space between the variable resistance elements 37 or cover the variable resistance element 37. For example, the second interlayer insulating layer 38 may be formed to have a surface to be positioned higher than the upper surface of the variable resistance element 37 to provide a space for the upper electrode contact to be formed in a subsequent process. The height of the second interlayer insulating layer 38 can be determined in consideration of the height of the upper electrode contact. The second interlayer insulating layer 38 may be formed with any single layer including an oxide layer, a nitride layer, or an oxynitride layer, or a stacked structure thereof.

Subsequently, the upper electrode contact 39 may be formed to penetrate the second interlayer insulating layer 38 over the variable resistance element 37 and to be coupled to the variable resistance element 37. The upper electrode contact 39 may be formed by forming a contact hole by etching a portion of the second interlayer insulating layer 38 so as to expose the top of the variable resistance element 37, and filling the contact hole with a conductive material. The upper electrode contact 39 may function to electrically couple the variable resistance element 37 and metal wirings 42A to be formed through a following process. Further, in some implementations, the upper electrode contact 39 may function as an electrode for the variable resistance element 37. In some implementations, The upper electrode contact 39 may be formed with the same material as the lower electrode contact 33.

Then, the third interlayer insulating layer 40 may be formed over the second interlayer insulating layer 38. The third interlayer insulating layer 40 may include any single layer including an oxide layer, a nitride layer, or an oxynitride layer, or a stacked structure thereof.

Subsequently, a contact hole 41 may be formed to penetrate the third interlayer insulating layer 40 and to expose the upper electrode contact 39.

Figure 5D:
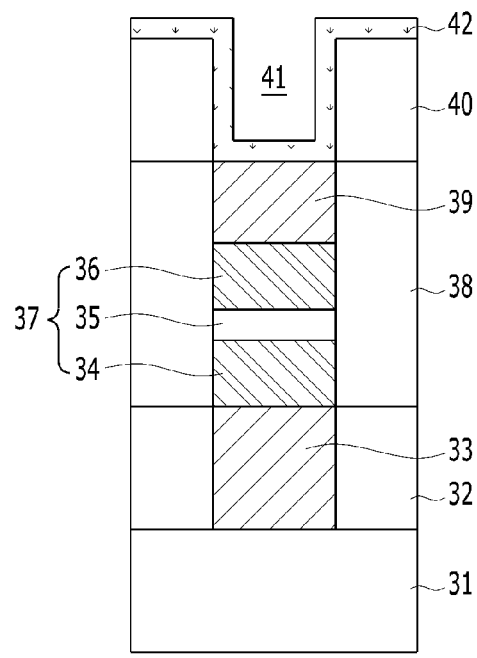

As shown in FIG. 5d, a barrier layer 42 including tungsten, boron and iridium may be formed along the structure (e.g., the entire structure) including the contact hole 41. The barrier layer 42 including the tungsten, boron and iridium may include a structure in which a tungsten-iridium alloy is doped with boron. The barrier layer 42 may be formed by performing the same process as discussed with reference to FIGS. 2b and 3.

Figure 5E:
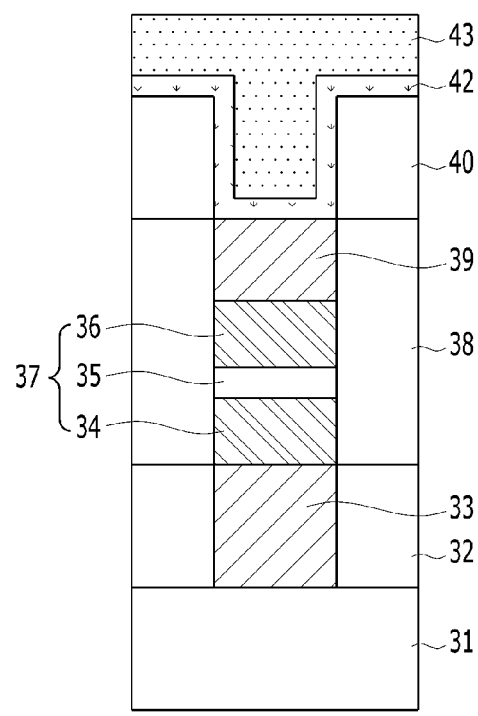

As shown in FIG. 5e, a metal layer 43 to fill the remaining portion of the contact hole 41 may be formed over the barrier layer 42. The metal layer 43 may include, for example, a tungsten layer. The tungsten layer may be formed in situ in the same chamber in which the barrier layer 42 is formed. The metal layer 43 may be formed by performing the same process as discussed with reference to FIGS. 2c and 3.

Figure 5F:
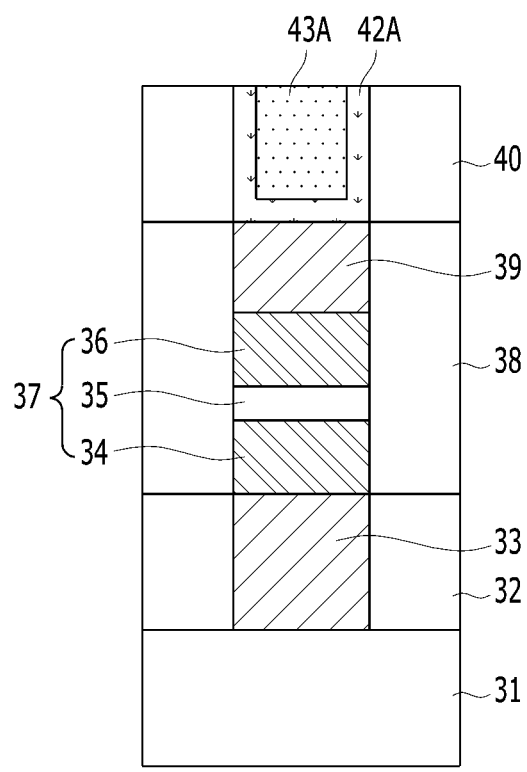

As shown in FIG. 5f, a separating process may be performed on the metal layer 43 (see FIG. 5e) and the barrier layer 42 (see FIG. 5e). A barrier layer 42A and a metal layer 43A, which have been subjected to the separating process, can remain in the inside of the contact hole 41.

Although the metal wiring of the present implementation has been described to have a damascene structure, other implementations are also possible. For example, the metal wiring can include various wirings and/or electrode structures to which a tungsten layer is applied.

According to an electronic device including a semiconductor memory and a method for fabricating the same in accordance with the implementations of the disclosed technology, the fabrication process may be simplified, and the characteristics of the variable resistance element can be improved.

The above and other memory circuits or semiconductor devices based on the disclosed technology can be used in a range of devices or systems. FIGS. 6-10 provide some examples of devices or systems that can implement the memory circuits disclosed herein.

Figure 6:
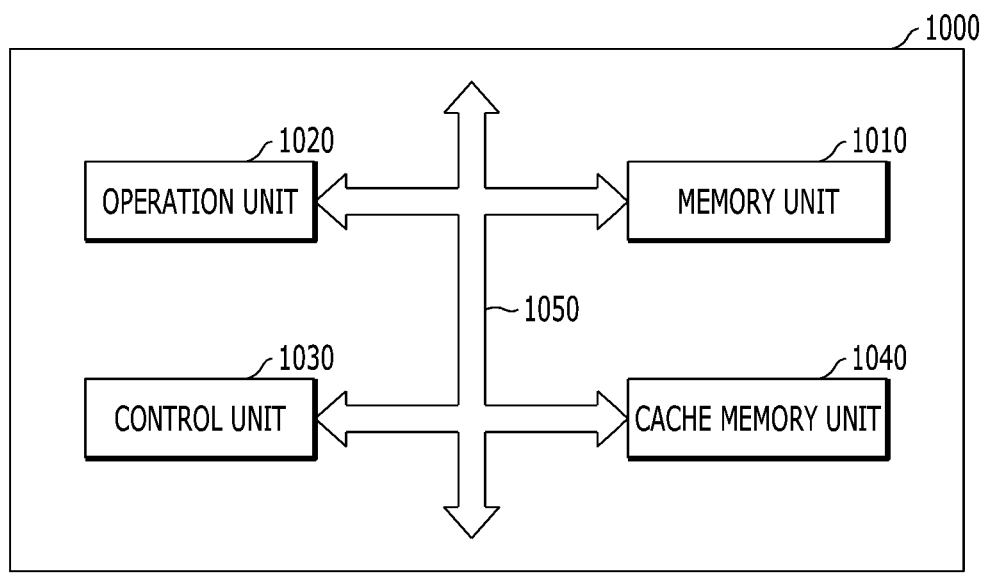
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element capable of being formed over a substrate; an interlayer insulating layer capable of being filled between the variable resistance element; an upper electrode contact capable of penetrating a portion of the interlayer insulating layer, and being in contact with the variable resistance element; and a metal wiring capable of being formed over the interlayer insulating layer, and including a stacked structure of a tungsten layer and a barrier layer which is in contact with the upper electrode contact and includes tungsten, boron and iridium. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
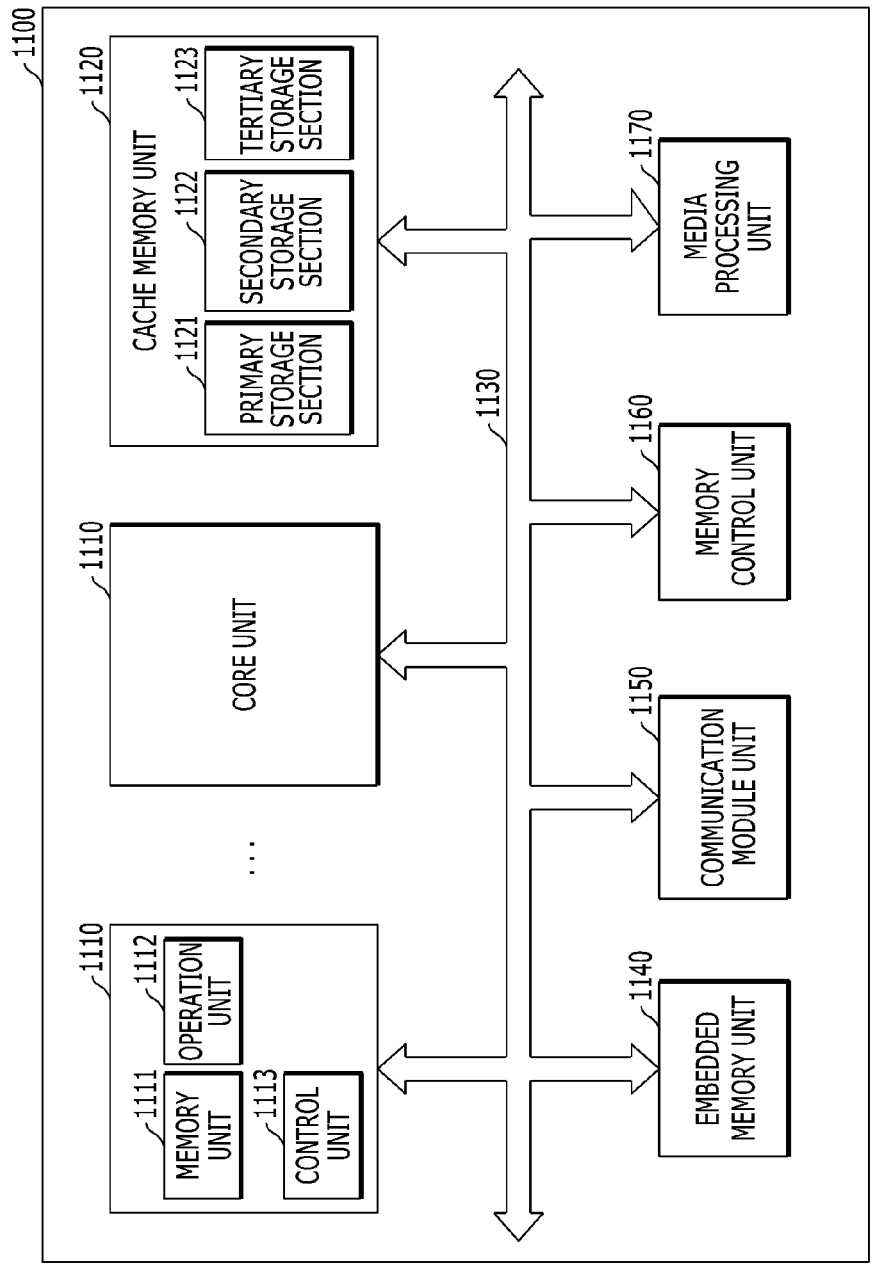
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element capable of being formed over a substrate; an interlayer insulating layer capable of being filled between the variable resistance element; an upper electrode contact capable of penetrating a portion of the interlayer insulating layer, and being in contact with the variable resistance element; and a metal wiring capable of being formed over the interlayer insulating layer, and including a stacked structure of a tungsten layer and a barrier layer which is in contact with the upper electrode contact and includes tungsten, boron and iridium. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
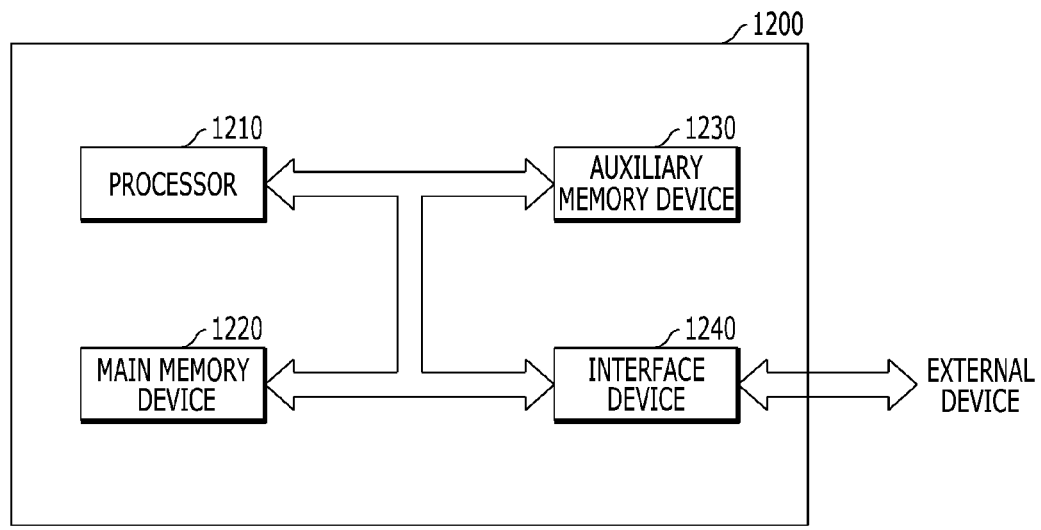
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element capable of being formed over a substrate; an interlayer insulating layer capable of being filled between the variable resistance element; an upper electrode contact capable of penetrating a portion of the interlayer insulating layer, and being in contact with the variable resistance element; and a metal wiring capable of being formed over the interlayer insulating layer, and including a stacked structure of a tungsten layer and a barrier layer which is in contact with the upper electrode contact and includes tungsten, boron and iridium. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element capable of being formed over a substrate; an interlayer insulating layer capable of being filled between the variable resistance element; an upper electrode contact capable of penetrating a portion of the interlayer insulating layer, and being in contact with the variable resistance element; and a metal wiring capable of being formed over the interlayer insulating layer, and including a stacked structure of a tungsten layer and a barrier layer which is in contact with the upper electrode contact and includes tungsten, boron and iridium. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
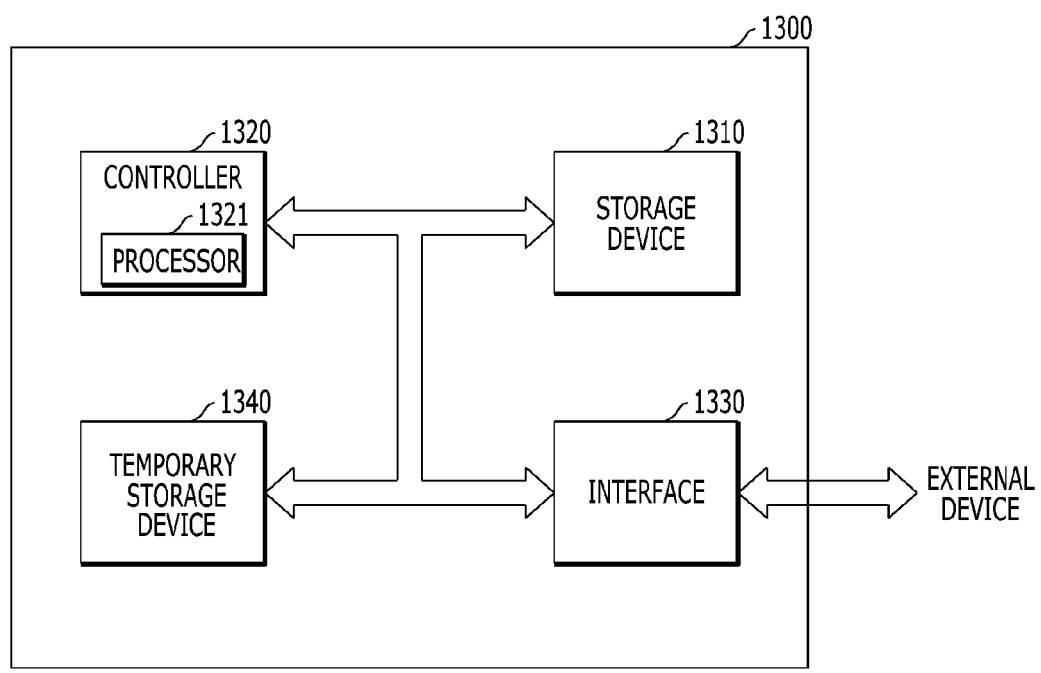
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element capable of being formed over a substrate; an interlayer insulating layer capable of being filled between the variable resistance element; an upper electrode contact capable of penetrating a portion of the interlayer insulating layer, and being in contact with the variable resistance element; and a metal wiring capable of being formed over the interlayer insulating layer, and including a stacked structure of a tungsten layer and a barrier layer which is in contact with the upper electrode contact and includes tungsten, boron and iridium. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 10:
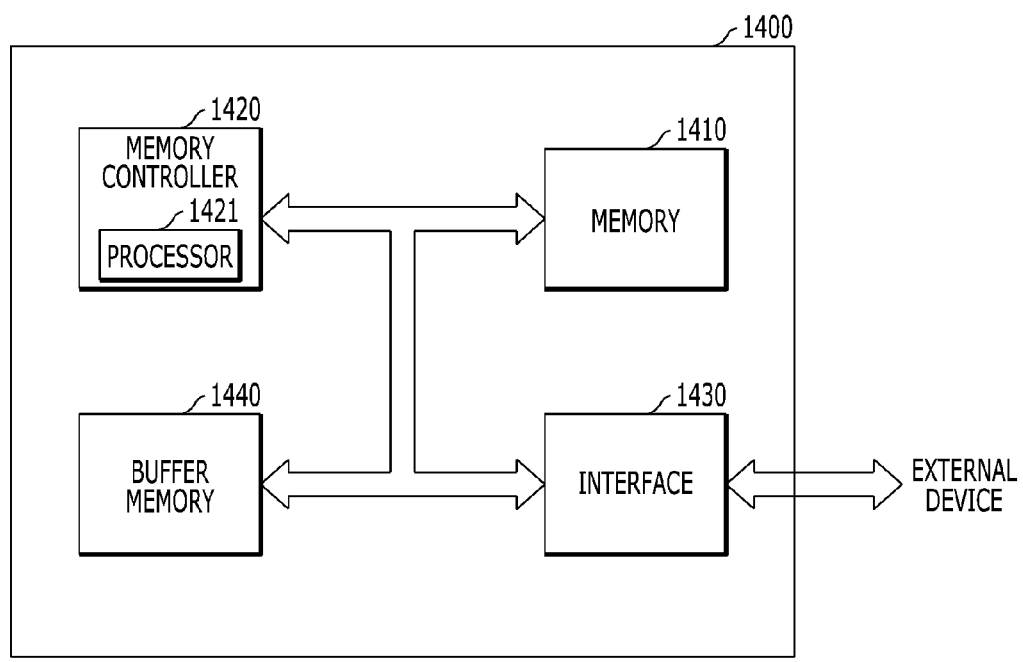
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element capable of being formed over a substrate; an interlayer insulating layer capable of being filled between the variable resistance element; an upper electrode contact capable of penetrating a portion of the interlayer insulating layer, and being in contact with the variable resistance element; and a metal wiring capable of being formed over the interlayer insulating layer, and including a stacked structure of a tungsten layer and a barrier layer which is in contact with the upper electrode contact and includes tungsten, boron and iridium. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element capable of being formed over a substrate; an interlayer insulating layer capable of being filled between the variable resistance element; an upper electrode contact capable of penetrating a portion of the interlayer insulating layer, and being in contact with the variable resistance element; and a metal wiring capable of being formed over the interlayer insulating layer, and including a stacked structure of a tungsten layer and a barrier layer which is in contact with the upper electrode contact and includes tungsten, boron and iridium. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated in this patent document.

What is claimed is:

1. An electronic device comprising a semiconductor memory, the semiconductor memory comprising:
   a substrate;
   a variable resistance element formed over the substrate and exhibiting different resistance states to store data;
   an interlayer insulating layer formed over the substrate to surround at least a portion of the variable resistance element;
   an upper electrode contact formed over the variable resistance element to penetrate a portion of the interlayer insulating layer and be in contact with the variable resistance element; and
   a metal wiring formed over the interlayer insulating layer, and comprising a stacked structure of a tungsten layer and a barrier layer, wherein the barrier layer is in contact with the upper electrode contact and comprises tungsten, boron and iridium, and
   wherein the barrier layer includes a structure in which a tungsten-iridium alloy is doped with the boron.

2. The electronic device of claim 1, further comprising a lower electrode contact coupled to the substrate and the variable resistance element.

3. The electronic device of claim 1, wherein the barrier layer has a content of the boron in a range of 1% to 10%.

4. The electronic device of claim 1, wherein the barrier layer has a poly-crystallized hexagonal structure.

5. The electronic device of claim 1, wherein the tungsten layer has a hexagonal structure.

6. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory unit that includes the resistance variable element is part of the memory unit in the microprocessor.

7. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that includes the resistance variable element is part of the cache memory unit in the processor.

8. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory unit that includes the resistance variable element is part of the auxiliary memory device or the main memory device in the processing system.

9. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside, wherein the semiconductor memory unit that includes the resistance variable element is part of the storage device or the temporary storage device in the data storage system.

10. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory unit that includes the resistance variable element is part of the memory or the buffer memory in the memory system.

11. The electronic device of claim 1, wherein the barrier layer is arranged to surround a bottom surface and a side surface of the tungsten layer.

12. The electronic device of claim 1, wherein the tungsten layer has a width smaller than that of the barrier layer.

13. The electronic device of claim 1, wherein the tungsten layer has a thickness smaller than that of the barrier layer.

14. The electronic device of claim 1, wherein the barrier layer has a thickness in a range of 25 Å to 500 Å.

15. The electronic device of claim 1, wherein the metal layer has grains with reduced size and reduced surface roughness as compared with a metal layer not including tungsten, boron and iridium.

* * * * *